United States Patent
Martin (10) Patent No.: US 10,172,263 B1
(45) Date of Patent: Jan. 1, 2019

(54) ELECTRONIC ASSEMBLY HAVING A CONDUCTIVE SHIELD AND GROUNDING CONTACTS

(71) Applicant: TE CONNECTIVITY CORPORATION, Berwyn, PA (US)

(72) Inventor: Galen M. Martin, Mechanicsburg, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/904,854

(22) Filed: Feb. 26, 2018

(51) Int. Cl.
  *H05K 9/00* (2006.01)
  *H01R 12/58* (2011.01)
  *H05K 1/02* (2006.01)
  *H05K 1/11* (2006.01)
  *H01R 4/26* (2006.01)

(52) U.S. Cl.
  CPC ............ *H05K 9/0024* (2013.01); *H01R 4/26* (2013.01); *H01R 12/585* (2013.01); *H05K 1/0216* (2013.01); *H05K 1/115* (2013.01); *H05K 9/0035* (2013.01); *H05K 2201/09609* (2013.01)

(58) Field of Classification Search
  CPC .......................... H05K 9/0032; H05K 9/0035
  See application file for complete search history.

(56) References Cited

U.S. PATENT DOCUMENTS

| | | | | |
|---|---|---|---|---|
| 4,754,101 A | * | 6/1988 | Stickney | H05K 9/0032 174/383 |
| 5,559,676 A | * | 9/1996 | Gessaman | H05K 1/141 174/377 |
| 7,095,624 B2 | * | 8/2006 | Daoud | H05K 9/0016 29/830 |

* cited by examiner

*Primary Examiner* — Hung V Ngo (57) ABSTRACT

Electronic assembly includes a printed circuit having a plurality of thru-holes. The electronic assembly also includes a conductive shield having a plurality of sidewalls. The sidewalls define a cavity. Edges of at least some of the sidewalls interface with the printed circuit along a perimeter line. The perimeter line intersects the thru-holes or extends immediately adjacent to the thru-holes. The electronic assembly also includes a plurality of grounding contacts that are each discrete with respect to the conductive shield. Each of the grounding contacts of said plurality includes a pin segment and a wall-engaging segment. The pin segments include compliant pins that are insertable into the thru-holes. The wall-engaging segments are connected to respective sidewalls. The grounding contacts are distributed along the perimeter line and electrically couple the conductive shield to the ground conductor of the printed circuit.

20 Claims, 5 Drawing Sheets

ELECTRONIC ASSEMBLY HAVING A CONDUCTIVE SHIELD AND GROUNDING CONTACTS

BACKGROUND

The subject matter herein relates generally to conductive shields that surround electronic components for protecting the electronic components or surrounding components from electromagnetic interference.

Electronic components are configured to perform designated tasks and are often mounted onto printed circuits. For example, integrated circuits or other logic-based devices may be mounted to a printed circuit board (PCB) and be communicatively coupled to other components of a system through conductive traces of the PCB. Electronic components may be susceptible to electromagnetic interface (EMI) and/or generate EMI that may cause unwanted effects to other nearby components. As such, it may be desirable to isolate other components on the PCB, reduce crosstalk, and/or reduce EMI susceptibility without negatively impacting performance.

To this end, an electronic component may be protected by a conductive shield, which may also be referred to as a board-level shield. The conductive shield may be stamped from sheet metal and shaped to form a box-like container. The conductive shield is positioned onto the printed circuit such that the electronic component is surrounded by the conductive shield. The conductive shield is designed to electrically couple to a ground conductor of the printed circuit (e.g., ground plane) through a plurality of terminals. More specifically, the sheet metal is stamped to include sidewalls and elongated terminals. As such, the sidewalls and terminals are portions of the same piece of sheet metal. The sheet metal is then shaped such that the sidewalls essentially form the desired container and the terminals are positioned to be inserted into plated thru-holes of the printed circuit. Accordingly, the electronic component may be positioned on the printed circuit and the conductive shield may be mounted over the electronic component.

Although such conductive shields are sufficient for impeding EMI leakage, the conductive shield is typically designed for particular applications, which may limit the use of a certain design, and can be costly to manufacture.

Accordingly, a need remains for conductive shields that are less costly to manufacture and/or are more easily adapted for different applications, and yet are sufficiently capable of impeding EMI leakage.

BRIEF DESCRIPTION

In an embodiment, an electronic assembly is provided that includes a printed circuit having a ground conductor and a plurality of thru-holes. The thru-holes expose conductive material that is in communication with the ground conductor. The electronic assembly also includes a conductive shield having a plurality of sidewalls. The sidewalls define a cavity that is sized and shaped to receive an electronic component therein. Edges of at least some of the sidewalls interface with the printed circuit along a perimeter line. The perimeter line intersects the thru-holes or extends immediately adjacent to the thru-holes. The electronic assembly also includes a plurality of grounding contacts that are each discrete with respect to the conductive shield. Each of the grounding contacts of said plurality includes a pin segment and a wall-engaging segment. The pin segments include compliant pins that are insertable into the thru-holes. The wall-engaging segments are connected to respective sidewalls. The grounding contacts are distributed along the perimeter line and electrically couple the conductive shield to the ground conductor of the printed circuit.

In some aspects, the perimeter line defines a closed area. The grounding contacts are substantially evenly distributed along the perimeter line.

In some aspects, the wall-engaging segment includes first and second arms that extend parallel to one another with a contact slot therebetween. The first and second arms are sized and shaped to receive a thickness of the respective sidewall such that the first and second arms engage opposite wall surfaces of the sidewall.

Optionally for some aspects, a contact plane intersects contact edges that extend along the first and second arms. The first and second arms are deflected away from each other in directions along the contact plane Optionally for some aspects, the sidewalls include respective wall slots and the pin segments include respective neck portions. The neck portions clear the printed circuit and are disposed within the respective wall slots.

Optionally for some aspects, the first and second arms include wall fingers. The wall fingers engage and permit the sidewall to slide through the contact slot.

Optionally for some aspects, the first and second arms have distal ends with corresponding contoured edges. The contoured edges are configured to direct the sidewall into the contact slot between the first and second arms during an operation in which the sidewall is inserted between the first and second arms. Optionally, the contact slot has a width and the contoured edges define a maximum receiving width. The maximum receiving width may be at least two times the width of the contact slot In some aspects, the grounding contact is stamped from sheet metal and has opposite first and second contact surfaces. The first contact surface is positioned side-by-side with the respective sidewall and is secured thereto. Optionally, the perimeter line defines a closed area. The grounding contacts may be substantially evenly distributed along the perimeter line. Optionally, the grounding contacts are welded to exterior or interior surfaces of the sidewalls.

In an embodiment, a shielding sub-assembly is provided. The shielding sub-assembly includes a conductive shield having a plurality of sidewalls. The sidewalls define a cavity that is sized and shaped to receive an electronic component therein. Edges of at least some of the sidewalls are configured to interface with a surface along a perimeter line. The shielding sub-assembly also includes a plurality of grounding contacts that are each discrete with respect to the conductive shield. Each of the grounding contacts of said plurality includes a pin segment and a wall-engaging segment. The pin segments include compliant pins that are insertable into thru-holes and the wall-engaging segments are connected to respective sidewalls. The grounding contacts are configured to be distributed along the perimeter line and electrically couple the conductive shield to a ground conductor.

In some aspects, the perimeter line defines a closed area. The grounding contacts are substantially evenly distributed along the perimeter line.

In some aspects, the wall-engaging segment includes first and second arms that extend parallel to one another with a contact slot therebetween. The first and second arms are sized and shaped to receive a thickness of the respective sidewall such that the first and second arms engage opposite wall surfaces of the sidewall.

Optionally for some aspects, a contact plane intersects contact edges that extend along the first and second arms. The first and second arms are configured to be deflected away from each other in directions along the contact plane.

Optionally for some aspects, the sidewalls include respective wall slots and the pin segments include respective neck portions. The neck portions clear the printed circuit and being disposed within the respective wall slots.

Optionally for some aspects, the first and second arms include wall fingers. The wall fingers engage and permit the sidewall to slide through the contact slot.

Optionally for some aspects, the first and second arms have distal ends with corresponding contoured edges. The contoured edges are configured to direct the sidewall into the contact slot between the first and second arms.

In some embodiments, the grounding contact is stamped from sheet metal and has opposite first and second contact surfaces. The first contact surface is positioned side-by-side with the respective sidewall and is secured thereto. Optionally, the grounding contacts are welded to exterior or interior surfaces of the sidewalls.

DETAILED DESCRIPTION

Embodiments set forth herein may include electronic assemblies, shielding sub-assemblies, and grounding contacts that may be used to reduce electromagnetic interference (EMI) leakage or radiation. Embodiments may be used for various applications throughout different industries. The electronic assemblies and shielding sub-assemblies include conductive shields and grounding contacts that are discrete with respect to the conductive shields. The grounding contact forms an electrical path between the conductive shield and a ground conductor.

The conductive shields may be characterized as board-level shields. In some embodiments, the board-level shields are stamped-and-formed from sheet metal. The sheet metal may have a designated thickness (e.g., 0.8 mm or more) for achieving a desired performance. A board-level shield may be a one-piece shield. In some instances, however, the board-level shield may have two pieces or more. The board-level shields may be designed to isolate components on a printed circuit board (PCB), reduce crosstalk, and/or reduce EMI susceptibility without negatively impacting performance. One material for making the board-level shields is cold rolled steel (CRS) material. Another material that may be used is an aluminum material (e.g., plated aluminum), which may have be ⅓ the density of CRS while offering similar EMI suppression capabilities. Aluminum material may also provide up to 5 times better heat dissipation than CRS. Other possible materials include galvanized steel, stainless steel, and nickel-silver (e.g., nickel-silver C770). It should be understood that embodiments may include more than one material.

As used herein, a conductive shield and a grounding contact are "discrete" with respect to one another if the two elements are independent parts prior to assembling the shielding sub-assembly. For example, a conductive shield and a grounding contact are discrete if the elements are derived from different stampings of sheet metal. Although two elements may be discrete, the two elements are not required to have different compositions. In other words, the two elements may have the same conductive material or be derived from the same sheet metal. In many cases, however, the two elements may be manufactured using different materials and/or different methods. In such embodiments, the conductive shield may be manufactured using a less costly material.

Grounding contacts described herein may include a plurality of different materials. For example, a grounding contact may include a base material, such as, but not limited to, copper or copper alloy (e.g., beryllium copper), that is plated or coated with one or more other materials. As used herein, when another material is "plated over" or "coated over" a base material, the other material may directly contact or bond to an outer surface of the base material or may directly contact or bond to an outer surface of an intervening material. More specifically, the other material is not required to be directly adjacent to the base material and may be separated by an intervening layer.

As used herein, phrases such as "a plurality of [elements]" and "an array of [elements]" and/or the like, when used in the detailed description and claims, do not necessarily include each and every element that a component may have. The component may have other elements that are similar to the plurality of elements. For example, the phrase "a shielding sub-assembly having a plurality of grounding contacts [being/having a recited feature]" does not necessarily mean that each and every grounding contact of the shielding sub-assembly has the recited feature. Other grounding contacts may not include the recited feature. Accordingly, unless explicitly stated otherwise (e.g., "each and every grounding contact of the shielding sub-assembly [being/having a recited feature]"), embodiments may include similar elements that do not have the recited features.

Figure 1:
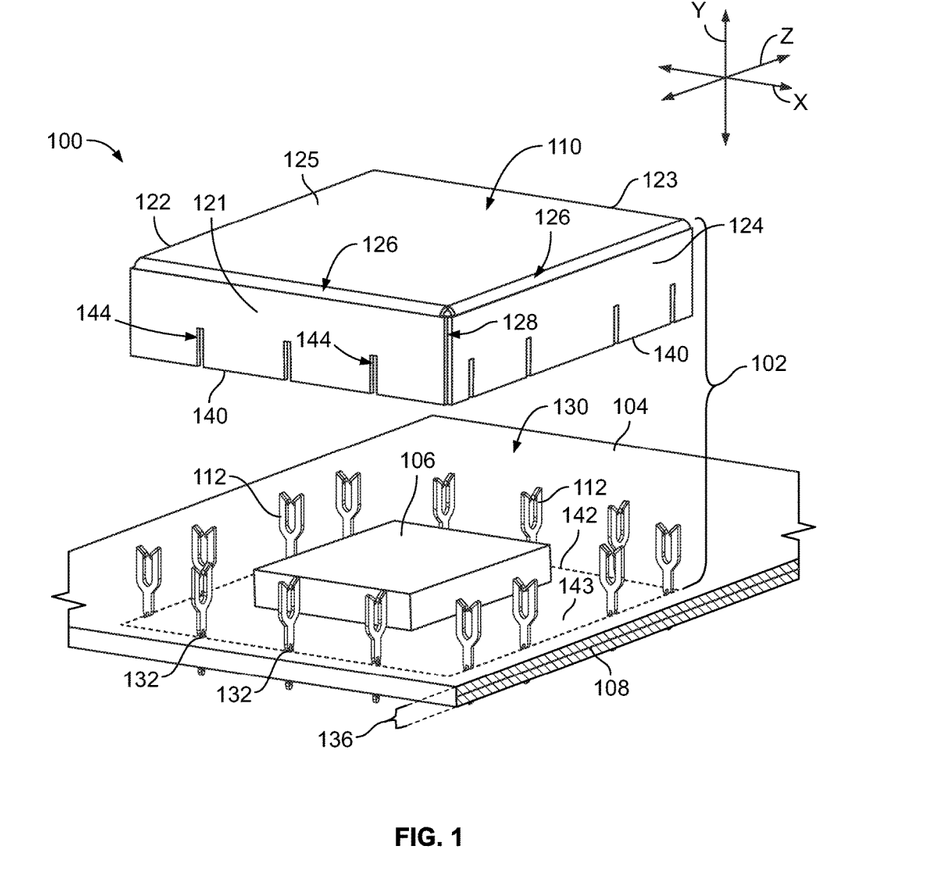
FIG. 1 is a partially exploded view of an electronic assembly formed in accordance with an embodiment.

FIG. 1 is a partially exploded view of an electronic assembly 100 formed in accordance with an embodiment. The electronic assembly 100 includes a shielding or grounding sub-assembly 102, a printed circuit 104, and an electronic component 106. The electronic component 106 is an electrical device that is positionable along a printed circuit. For example, the electronic component may be an integrated circuit, microprocessor, electrical connector, capacitor, battery, etc. In particular embodiments, the electronic component 106 may be configured to process data signals. The electronic assembly 100 and the corresponding elements are oriented with respect to mutually perpendicular X, Y, and Z axes. Although the Y axis appears to extend along the direction of gravity, it should be understood that embodiments may have any orientation with respect to gravity.

The shielding sub-assembly 102 includes a conductive shield 110 and a plurality of grounding contacts 112. The grounding contacts 112 and the conductive shield 110 are discrete with respect to one another. The grounding contacts 112 are configured to electrically connect the conductive shield 110 to a ground conductor 108 of the printed circuit 104. In the illustrated embodiment, the ground conductor 108 is a ground plane of the printed circuit 104, but other ground conductors may be used in alternative embodiments.

The conductive shield 110 includes a plurality of sidewalls 121-124 and a top wall 125. In the illustrated embodiment, the sidewalls 121-124 and the top wall 125 are portions of the same piece of sheet metal that is stamped-and-formed to provide the conductive shield 110. For example, each of the sidewalls 121-124 couples to the top wall 125 along a sheet fold 126 and extends along two other sidewalls along respective seams 128. In other embodiments, the conductive shield 110 may be formed from multiple discrete parts. Yet in other embodiments, the conductive shield 110 may be molded from a plastic material having conductive particles dispersed therein so that the molded shield is conductive.

In FIG. 1, the conductive shield 110 has a rectangular box-like shape. The conductive shield 110, however, may have other shapes. For example, the conductive shield 110 may have a pentagon shape in which the top wall 125 is shaped like a pentagon. The conductive shield 110 may be L-shaped in which the top wall 125 is L-shaped. The conductive shield 110 may be configured to have one or more design features, such as locking holes or surface mount technology (SMT) castellations.

The printed circuit 104 has a substrate surface 130 and an array of thru-holes 132. In the illustrated embodiment, the thru-holes 132 are plated thru-holes (PTHs) that extend entirely through a thickness 136 of the printed circuit 104. In other embodiments, however, the thru-holes 132 extend a depth into the printed circuit 104 that is less than the thickness 136. In other embodiments, the thru-holes 132 are not plated but expose at least a portion of the ground conductor 108.

The conductive shield 110 is configured to be positioned on the substrate surface 130 of the printed circuit 104. Each of the sidewalls 121-124 has a respective edge 140 that interfaces with the substrate surface 130 when the conductive shield 110 is mounted thereon. The edges 140 of at least some of the sidewalls interface with the printed circuit 104 along a perimeter line 142, which is identified by a dashed line along the substrate surface 130. The perimeter line 142 intersects the thru-holes 132 or extends immediately adjacent to the thru-holes 132 along the substrate surface 130. A perimeter line "intersects" a thru-hole if the perimeter line over an opening to the thru-hole. A perimeter line extends "immediately adjacent to" a thru-hole if the perimeter line extends over the plating that defines the opening to the thru-hole or is within a designated distance from the plating that defines the opening to the thru-hole.

The designated distance for determining whether the perimeter line extends immediately adjacent to the thru-hole is 2.0 mm or less. In particular embodiments, the designated distance may be 1.5 mm or, more particularly, 1.0 mm. The "plating that defines the thru-hole" is the thickness of conductive material that extends from a bored surface of the printed circuit toward a central axis of the thru-hole. The "plating that defines the thru-hole" does not include lateral pads that may extend alongside the exterior surface of the printed circuit. To determine whether the perimeter line is within the designated distance, the shortest distance between the perimeter line and the plating that defines the thru-hole may be measured. As an example, when the conductive shield is mounted onto the printed circuit such that a sidewall interfaces with the printed circuit, the shortest distance between the sidewall that interfaces the printed circuit and the plating that defines the thru-hole (e.g., a point that is vertically aligned with the bored surface) may be measured. If the shortest distance is equal to or less than the designated distance, then the perimeter line extends immediately adjacent to the thru-hole.

As shown, the perimeter line 142 may define a closed area 143 such that the perimeter line is devoid of gaps in which conductive material (e.g., edge or grounding contact) does not interface with the printed circuit. In other embodiments, however, an edge may not interface with the printed circuit. In such embodiments, the conductive shield may define an opening for receiving a pluggable connector or for allowing airflow.

In the illustrated embodiment, the grounding contacts 112 are substantially evenly distributed along the perimeter line 142. As used herein, grounding contacts are "substantially evenly distributed" if distances of the gaps between adjacent grounding contacts 112 (or thru-holes 132) are within a range of 0.5X and 1.5X, wherein X is the average distance between adjacent grounding contacts along the perimeter line. The distances are only measured along the perimeter line. If a gap exists in the perimeter line, the distance between the grounding contacts where the gap exists is not counted.

Optionally, each of the sidewalls 121-124 has multiple wall slots 144. In other embodiments, sidewalls may be devoid of wall slots or have only one wall slot. As described herein, the wall slots 144 are configured to receive respective grounding contacts 112.

Figures 2, 3:
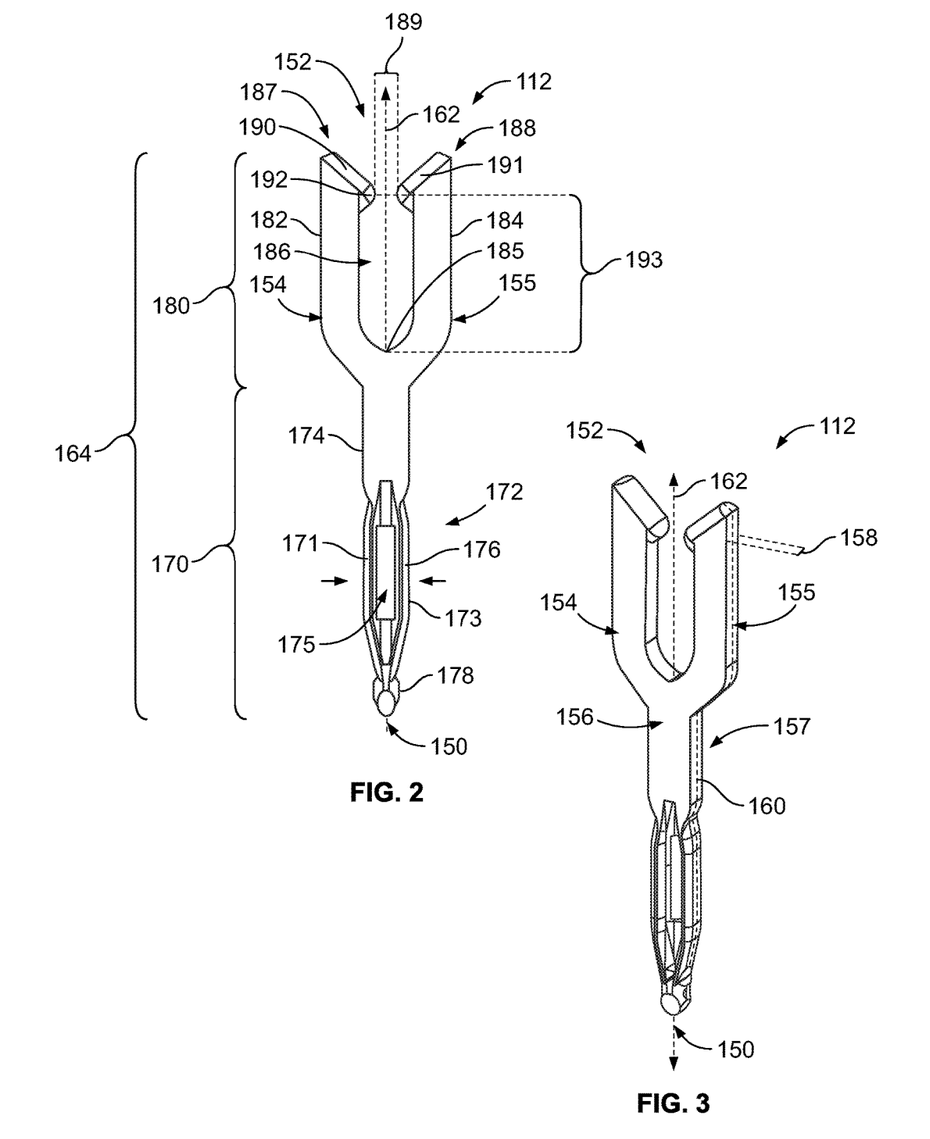
FIG. 2 is a plan view of a grounding contact that may be used with the electronic assembly of FIG. 1.
FIG. 3 is a perspective view of the grounding contact that may be used with the electronic assembly of FIG. 1.

FIGS. 2 and 3 are a plan view and a perspective view, respectively, of the grounding contact 112. The grounding contact 112 has a board end 150 and a shield end 152. The grounding contact 112 may be stamped from sheet metal. The grounding contact 112 has opposite contact edges 154, 155 that define an outer profile of the grounding contact 112. As shown in FIGS. 2 and 3, a longitudinal axis 162 extends through a geometric center of the grounding contact 112 between the board and shield ends 150, 152. A length 164 (FIG. 2) of the grounding contact 112 is defined between the board and shield ends 150, 152.

As shown in FIG. 3, the grounding contact 112 has opposite first and second contact surfaces 156, 157. The contact surfaces 156, 157 may also be referred to as broad side surfaces. A thickness 158 of the grounding contact 112 extends between the contact surfaces 156, 157. In the illustrated embodiment, the grounding contact 112 is essentially planar such that a contact plane 160 (indicated by a dashed line in FIG. 3) intersects an entirety of the contact edges 154, 155. In other embodiments, however, the grounding contact 112 may be shaped (e.g., bent) such that the grounding contact 112 is not planar.

As shown in FIG. 2, the grounding contact 112 may have a number of segments. For example, the grounding contact 112 includes a pin segment 170 and a wall-engaging segment 180. The pin segment 170 includes an elongated compliant pin 172 that is configured to be inserted into one of the thru-holes 132 (FIG. 1). The compliant pin 172 is configured to experience a radially-inward or compressive force (indicated by the opposing arrows) that is caused by the printed circuit 104 (FIG. 1).

The compliant pin 172 includes a neck portion 174, a compliant segment 176, and a tip portion 178. The compliant segment 176 extends outwardly from the neck portion 174, and the tip portion 178 extends inwardly from the compliant segment 176. In other words, the compliant segment 176 extends from the neck portion 174 to the tip portion 178. The tip portion 178 includes the board end 150. The compliant segment 176 includes two opposing arms 171 and 173. The arms 171 and 173 are spaced apart to define an opening 175 therebetween. As the compliant pin 172 is received within the thru-hole 132 (FIG. 1), the arms 171 and 173 engage the inner wall of the thru-hole 132 and are deflected inwardly toward each other.

The compliant pin 172 may be characterized as an eye-of-needle type compliant pin. Other types of compliant pins exist and may replace the compliant pin 172 in other embodiments.

The wall-engaging segment 180 also includes two opposing arms 182, 184 and a contact slot 186 therebetween. The arms 182, 184 extend from a joint 185 that is adjacent to the neck portion 174. The arms 182, 184 extend parallel to one another and the longitudinal axis 162 from the joint 185 to respective distal ends 187, 188. The distal ends 187, 188 are separated by an opening 189 to the contact slot 186. The distal ends 187, 188 and the opening 189 collectively define the shield end 152.

As shown in FIG. 2, the distal ends 187, 188 of the first and second arms 182, 184, respectively, include contoured edges 190, 191, respectively. Each of the arms 182, 184 includes a wall finger (or protuberance) 192 that is proximate to the respective distal end. The fingers 192 are configured to directly engage the conductive shield 110 (FIG. 1). An effective length 193 of the contact slot 186 is defined between the fingers 192 and the joint 185. The contoured edges 190, 191 are shaped to adjust the grounding contact 112 relative to the conductive shield 110 as described herein.

Figure 4:
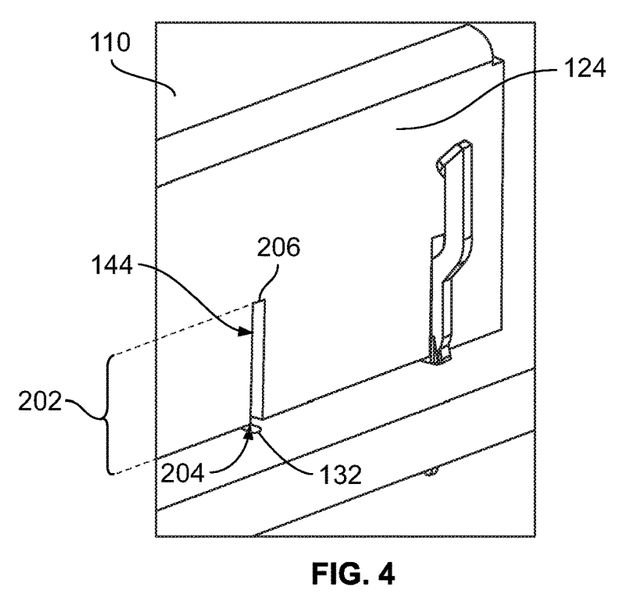
FIG. 4 illustrates a portion of the electronic assembly of FIG. 1 with a single ground contact removed to show a wall slot.
Figure 5:
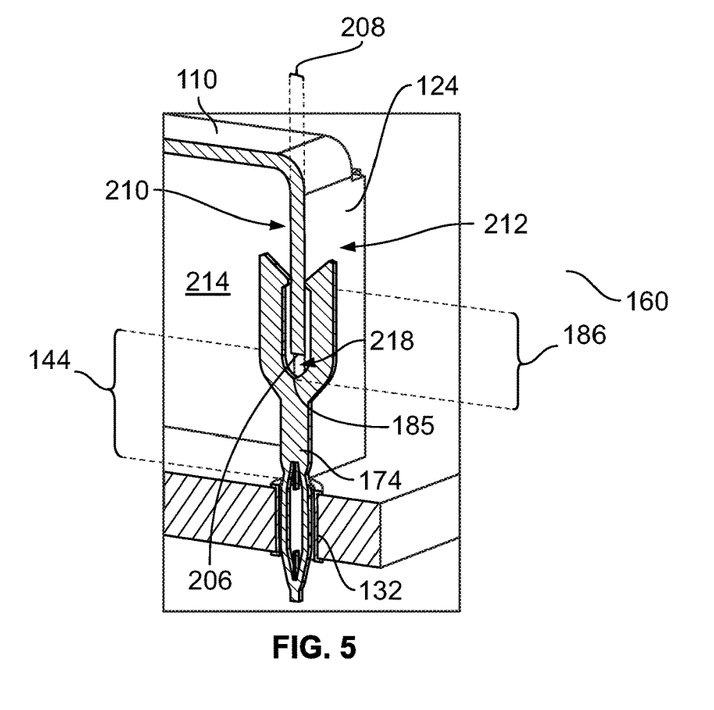
FIG. 5 is a sectional view of the electronic assembly of FIG. 1.

FIG. 4 illustrates a portion of the electronic assembly 100 after construction, and FIG. 5 is a sectional view of the electronic assembly 100 after construction. For illustrative purposes, a single grounding contact has been removed in FIG. 4 to show one of the wall slots 144 in greater detail. During construction, the grounding contacts 112 may be inserted into the thru-holes 132 followed by positioning the conductive shield 110. Alternatively, the grounding contacts 112 may be coupled to the conductive shield 110 and then inserted into the thru-holes 132 as the conductive shield 110 is positioned onto the printed circuit 104.

FIG. 4 includes the sidewall 124 of the conductive shield 110. The wall slot 144 has a length 202 measured from an opening 204 of the wall slot 144 to an end edge 206 of the wall slot 144. As shown in FIG. 5, the sidewall 124 has a thickness 208 that is defined between opposite wall surfaces 210, 212 of the sidewall 124. The wall slot 144 receives a portion (e.g., the neck portion 174) of the grounding contact 112, and the contact slot 186 receives a portion of a corresponding sidewall 121. The first arm 182 of the wall-engaging segment 180 is disposed within a cavity 214 of the conductive shield 110. The length 202 (FIG. 4) of the wall slot 144, and the length 193 (FIG. 2) of the contact slot 186 may be configured to permit tolerances in the shielding sub-assembly 102. For example, a tolerance gap 218 exists between the end edge 206 and the joint 185 in FIG. 5. Also shown, the neck portion 174 clears the printed circuit 104. In other words, the neck portion 174 is disposed within the respective wall slot 144 and extends into the respective thru-hole 132.

During a coupling operation in which the sidewall 124 is inserted through the slot opening 189, the fingers 192 of the first and second arms 182, 184 engage respective wall surfaces of the sidewall 124. The first and second arms 182, 184 are deflected away from one another. More specifically, the first and second arms 182, 184 may be deflected away from each other in directions along the contact plane 160 (FIG. 3).

Figure 6:
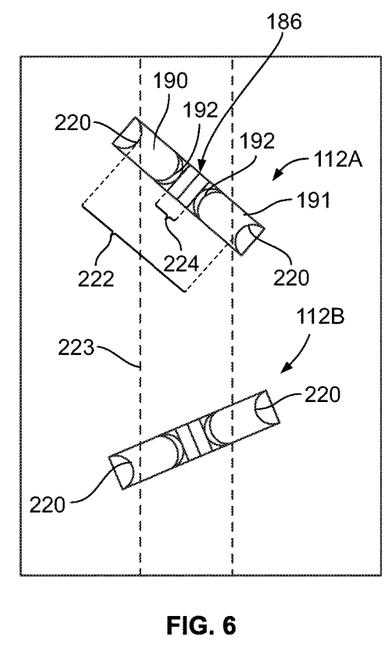
FIG. 6 is a top-down view of two grounding contacts that are adjacent to one another.

FIG. 6 is a top-down view of two grounding contacts 112A, 112B that are adjacent to one another. As shown, the grounding contacts 112A, 112B have different rotational orientations. For example, the grounding contact 112A appears rotated more clockwise than the grounding contact 112B. Despite the different rotational orientations, embodiments are configured to receive the corresponding sidewall 124 without individual manual adjustment of the grounding contacts 112A, 112B.

For example, the contoured edges 190, 191 have apexes 220 that define a maximum receiving width 222. The opposing fingers 192 define a slot width 224. In particular embodiments, the maximum receiving width 222 is at least one and a half times (1.5×) the slot width 224. In particular embodiments, the maximum receiving width 222 is at least two times (2×) the slot width 224 or at least 2.5 times (2.5×) the slot width 224. In such embodiments, the grounding contacts 112A, 112B may have different rotational orientations, as shown in FIG. 6, but are enabled to align with the sidewall 124. More specifically, the maximum receiving width 222 permits the sidewall 124 to be received by each of the contact slots 186. A tolerance zone 223 is shown between two dashed lines in FIG. 6 and represents the space in which the sidewall 124 may approach the contact slots 186 while being sufficiently aligned for insertion.

Figure 7:
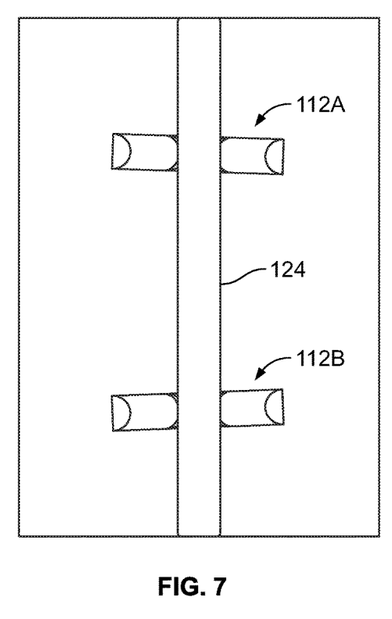
FIG. 7 is a top-down view of the electronic assembly showing the two grounding contacts and a portion of a sidewall that has been received by the grounding contacts.

Due to the shape of the contoured edges 190, 191, the grounding contacts 112A, 112B are partially self-aligned as the sidewall 124 is inserted into the contact slots 186. More specifically, the edge 140 (FIG. 1) of the sidewall 124 engages the contoured edges 190, 191 as the sidewall 124 is inserted into the contact slots 186 of the grounding contacts 112A, 112b. The force of insertion causes the grounding contacts 112A, 112B to rotate into an orientation that may better receive the sidewall 124. FIG. 7 illustrates the rotational orientations of the grounding contacts 112A, 112B after the sidewall 124 has been inserted into the contact slots 186.

Figure 8:
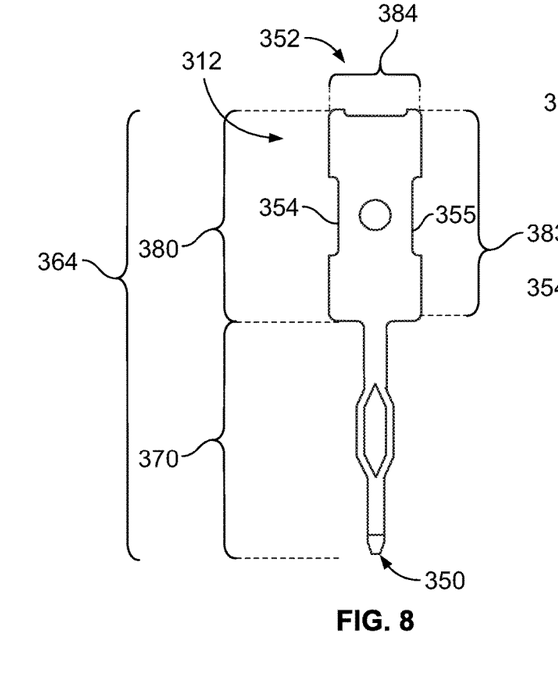
FIG. 8 is a plan view of a grounding contact that may be used with the electronic assembly of FIG. 1.
Figure 9:
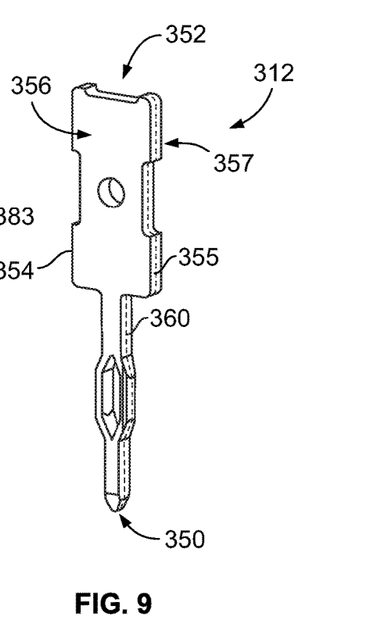
FIG. 9 is a perspective view of a grounding contact that may be used with the electronic assembly of FIG. 1.

FIGS. 8 and 9 are plan and perspective views, respectively, of a grounding contact 312. The grounding contact 312 has a board end 350 and a shield end 352. The grounding contact 312 may be stamped from sheet metal. The grounding contact 312 has opposite contact edges 354, 355 that define an outer profile of the grounding contact 312. A length 364 (FIG. 8) of the grounding contact 312 is defined between the board and shield ends 350, 352.

As shown in FIG. 9, the grounding contact 312 has opposite first and second contact surfaces 356, 357. A thickness 358 of the grounding contact 312 extends between the contact surfaces 356, 357. In the illustrated embodiment, the grounding contact 312 is essentially planar such that a contact plane 360 (indicated by a dashed line in FIG. 9) intersects an entirety of the contact edges 354, 355. In other embodiments, however, the grounding contact 312 may be shaped (e.g., bent) such that the grounding contact 312 is not planar.

As shown in FIG. 8, the grounding contact 312 may have a number of segments. For example, the grounding contact 312 includes a pin segment 370 and a wall-engaging segment 380. The pin segment 370 includes an elongated compliant pin 372 that is configured to be inserted into one of the thru-holes 132 (FIG. 1). The compliant pin 372 may be similar or identical to the compliant pin 172 (FIG. 2).

Figure 10:
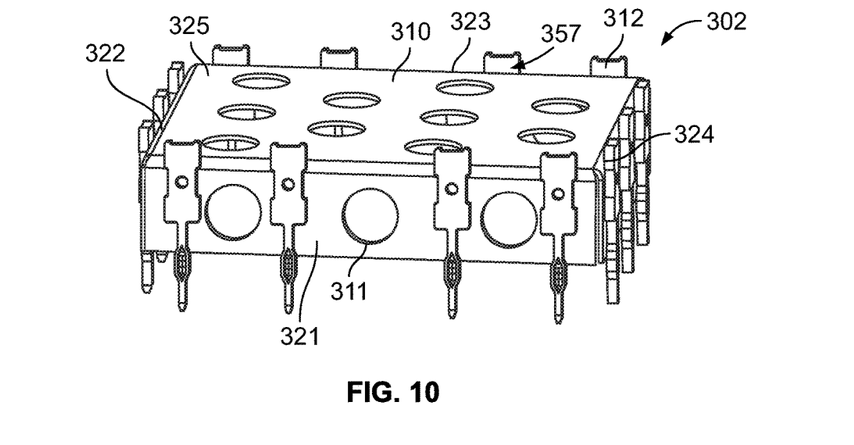
FIG. 10 illustrates at least a portion of shielding sub-assembly that may use the grounding contact of FIG. 8.

The wall-engaging segment 380 has a panel-shaped profile that includes a panel opening 382. For example, the wall-engaging segment 380 has a two-dimensional shape that includes a segment length 383 and a segment width 384. The segment length 383 and the segment width 384 are dimensioned to provide structural integrity to the grounding contact 312 when secured to a conductive shield 310 (FIG. 10). The panel opening 382 may be sized and shaped to receive soldering or permit welding of the wall-engaging segment 380 to the conductive shield 310.

FIG. 10 illustrates at least a portion of a shielding sub-assembly 302, which may be similar to the shielding sub-assembly 102 (FIG. 1). The shielding sub-assembly 302 includes the grounding contacts 312 and the conductive shield 310. The conductive shield 310 includes sidewalls 321-324 and a top wall 325. Optionally, the conductive shield 310 may include openings 311 for airflow. As shown, the wall-engaging segments 380 are secured to respective exteriors of the sidewalls 321-324. Alternatively, the wall-engaging segments 380 are secured to respective interior surfaces of the sidewalls 321-324. During construction, the contact surface 357 (FIG. 9) is positioned side-by-side with respect to one of the sidewalls. The wall-engaging segments 380 may be soldered or welded to respective interior or exterior surfaces of the sidewalls 321-324.

It should be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled.

As used in the description, the phrase "in an exemplary embodiment" and/or the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. § 112, sixth paragraph, unless and until such claim limitations expressly use the phrase "means for" followed by a statement of function void of further structure.

What is claimed is:

1. An electronic assembly comprising:
   a printed circuit having a ground conductor and a plurality of thru-holes, the thru-holes exposing conductive material that is in communication with the ground conductor, the printed circuit having a substrate surface;
   a conductive shield having a plurality of sidewalls, the sidewalls defining a cavity that is sized and shaped to receive an electronic component therein, wherein edges of at least some of the sidewalls interface with the printed circuit along a perimeter line, the perimeter line extending along the substrate surface and intersecting the thru-holes or extending immediately adjacent to the thru-holes;
   a plurality of grounding contacts that are each discrete with respect to the conductive shield, wherein each of the grounding contacts of said plurality comprises a pin segment and a wall-engaging segment;
   wherein the pin segments include compliant pins that are insertable into the thru-holes and the wall-engaging segments are connected to respective sidewalls, the grounding contacts being distributed along the perimeter line and electrically coupling the conductive shield to the ground conductor of the printed circuit, wherein the edges of the at least some sidewalls engage the substrate surface along the perimeter line as the edges extend between adjacent grounding contacts.

2. The electronic assembly of claim 1, wherein the perimeter line defines a closed area, the grounding contacts being substantially evenly distributed along the perimeter line.

3. The electronic assembly of claim 1, wherein the wall-engaging segment includes first and second arms that extend parallel to one another with a contact slot therebetween, the first and second arms being sized and shaped to receive a thickness of the respective sidewall such that the first and second arms engage opposite wall surfaces of the sidewall.

4. The electronic assembly of claim 3, wherein a contact plane intersects contact edges that extend along the first and second arms, the first and second arms being deflected away from each other in directions along the contact plane.

5. The electronic assembly of claim 3, wherein the sidewalls include respective wall slots and the pin segments include respective neck portions, the neck portions clearing the printed circuit and being disposed within the respective wall slots.

6. The electronic assembly of claim 3, wherein the first and second arms include respective protuberances that extend toward each other, the respective protuberances engaging and permitting the sidewall to slide through the contact slot.

7. The electronic assembly of claim 3, wherein the first and second arms have distal ends with corresponding contoured edges, the contoured edges configured to direct the sidewall into the contact slot between the first and second arms.

8. The electronic assembly of claim 7, wherein the contact slot has a slot width and the contoured edges define a maximum receiving width, the maximum receiving width being at least two times the slot width of the contact slot.

9. The electronic assembly of claim 3, wherein the sidewalls include respective wall slots, the respective wall slots receiving the contact slots, wherein the respective wall slots, the respective contact slots, and the respective sidewalls are sized and shaped such that tolerance gaps exist between the respective sidewall and the respective grounding contact when the edges engage the substrate surface, each of the tolerance gaps being a portion of the respective wall slot and a portion of the respective contact slot.

10. The electronic assembly of claim 1, wherein the grounding contact is stamped from sheet metal and has opposite first and second contact surfaces, the first contact surface positioned side-by-side with the respective sidewall and being secured thereto.

11. The electronic assembly of claim 10, wherein the perimeter line defines a closed area, the grounding contacts being substantially evenly distributed along the perimeter line.

12. A shielding sub-assembly comprising:
a conductive shield having a plurality of sidewalls, the sidewalls defining a cavity that is sized and shaped to receive an electronic component therein, wherein edges of at least some of the sidewalls are configured to interface with a surface along a perimeter line;
a plurality of grounding contacts that are each discrete with respect to the conductive shield, wherein each of the grounding contacts of said plurality comprises a pin segment and a wall-engaging segment;
wherein the pin segments include compliant pins that are insertable into thru-holes and the wall-engaging segments are connected to respective sidewalls, the grounding contacts configured to be distributed along the perimeter line and electrically couple the conductive shield to a ground conductor;
wherein the wall-engaging segment includes first and second arms that extend parallel to one another with a contact slot therebetween, the first and second arms being sized and shaped to receive a thickness of the respective sidewall such that the first and second arms engage opposite wall surfaces of the sidewall;
wherein the sidewalls include respective wall slots and the pin segments include respective neck portions, the neck portions clearing the printed circuit and being disposed within the respective wall slots.

13. The shielding sub-assembly of claim 12, wherein the perimeter line defines a closed area, the grounding contacts being substantially evenly distributed along the perimeter line.

14. The shielding sub-assembly of claim 12, wherein a contact plane intersects contact edges that extend along the first and second arms, the first and second arms configured to be deflected away from each other in directions along the contact plane.

15. The shielding sub-assembly of claim 12, wherein the first and second arms include respective protuberances that extend toward each other, the respective protuberances engaging and permitting the sidewall to slide through the contact slot.

16. The shielding sub-assembly of claim 12, wherein the first and second arms have distal ends with corresponding contoured edges, the contoured edges configured to direct the sidewall into the contact slot between the first and second arms.

17. The shielding sub-assembly of claim 12, wherein a length of the respective wall slot is greater than an effective length of the respective contact slot, the effective length of the respective contact slot being measured from a joint of the pin segment to where the first and second arms directly engage the conductive shield during operation, the first and second arms extending from the pin segment at the joint.

18. The shielding sub-assembly of claim 12, wherein the a pin segment includes a neck portion, a tip portion, and a compliant segment extending between the neck portion and the tip portion, the compliant segment extending outwardly from the neck portion, the tip portion extending inwardly from the compliant segment, wherein the compliant segment includes two opposing arms that are spaced apart and are configured to be deflected inwardly.

19. A shielding sub-assembly comprising:
a conductive shield having a plurality of sidewalls, the sidewalls defining a cavity that is sized and shaped to receive an electronic component therein, wherein edges of at least some of the sidewalls are configured to interface with a surface along a perimeter line;
a plurality of grounding contacts that are each discrete with respect to the conductive shield, wherein each of the grounding contacts of said plurality comprises a pin segment and a wall-engaging segment;
wherein the pin segments include compliant pins that are insertable into thru-holes and the wall-engaging segments are connected to respective sidewalls, the grounding contacts configured to be distributed along the perimeter line and electrically couple the conductive shield to a ground conductor;
wherein the grounding contact is stamped from sheet metal and has first and second broad side surfaces that extend parallel to each other, the first broad side surface along the wall-engaging segment being positioned side-by-side with an interior or an exterior surface of the respective sidewall and being secured thereto.

20. The shielding sub-assembly of claim 19, wherein the grounding contacts are welded to exterior or interior surfaces of the sidewalls.

* * * * *